(12) United States Patent
Lin et al.

(10) Patent No.: US 7,381,634 B2
(45) Date of Patent: Jun. 3, 2008

(54) INTEGRATED CIRCUIT SYSTEM FOR BONDING

(75) Inventors: Yaojian Lin, Singapore (SG); Byung Tai Do, Singapore (SG); Wan Lay Looi, Singapore (SG); Haijing Cao, Singapore (SG)

(73) Assignee: Stats Chippac Ltd., Singapore (SG)

( * ) Notice: Subject to any disclaimer, the term of this patent is extended or adjusted under 35 U.S.C. 154(b) by 46 days.

(21) Appl. No.: 10/907,732

(22) Filed: Apr. 13, 2005

(65) Prior Publication Data

US 2006/0231948 A1    Oct. 19, 2006

(51) Int. Cl.
*H01L 21/44* (2006.01)

(52) U.S. Cl. .................. 438/612; 438/613; 438/614; 438/617; 257/E21.476; 257/734

(58) Field of Classification Search ............... 438/612, 438/613, 614, 615, 106, 118, 617; 257/E21.476
See application file for complete search history.

(56) References Cited

U.S. PATENT DOCUMENTS

| | | | |
|---|---|---|---|
| 2,974,021 A * | 3/1961 | Borowik .................. 216/109 |
| 6,162,652 A * | 12/2000 | Dass et al. .................. 438/18 |
| 6,181,569 B1 | 1/2001 | Chakravorty ................ 361/761 |
| 6,232,212 B1 * | 5/2001 | Degani et al. .............. 438/612 |
| 6,620,720 B1 * | 9/2003 | Moyer et al. ................ 438/612 |
| 6,762,122 B2 * | 7/2004 | Mis et al. ................... 438/683 |
| 6,784,020 B2 | 8/2004 | Lee ............................. 438/106 |
| 6,835,300 B2 * | 12/2004 | Zhu et al. .................... 205/676 |
| 7,081,404 B2 * | 7/2006 | Jan et al. ..................... 438/613 |
| 7,176,117 B2 * | 2/2007 | Huang .......................... 438/614 |
| 2003/0157790 A1 * | 8/2003 | Tong et al. .................. 438/613 |
| 2005/0012211 A1 * | 1/2005 | Kung et al. .................. 257/734 |
| 2005/0017355 A1 * | 1/2005 | Chou et al. .................. 257/738 |

* cited by examiner

*Primary Examiner*—Michael S. Lebentritt
*Assistant Examiner*—Angel Roman
(74) *Attorney, Agent, or Firm*—Mikio Ishimaru

(57) ABSTRACT

An integrated circuit system provides a precursor for an integrated wire bond and flip chip structure. The precursor has a plurality of contact pads thereon. A layer of titanium is deposited on the precursor. A layer of nickel-vanadium is deposited on the layer of titanium. A layer of copper is deposited on the layer of nickel-vanadium. A mask is formed on at least a portion of the layer of copper. Portions of the layers of copper and nickel-vanadium not protected by the mask are removed to expose portions of the layer of titanium. The exposed portions of the layer of titanium are etched with an etching solution consisting of an etchant, a viscosity modifier, and an oxidizer.

18 Claims, 3 Drawing Sheets

INTEGRATED CIRCUIT SYSTEM FOR BONDING

TECHNICAL FIELD

The present invention relates generally to semiconductor technology, and more particularly to integrated circuit systems for bonding having wire bond and solder bump metallization and patterning for wafer level packages.

BACKGROUND ART

In the manufacture and assembly of electronic devices, two high-density interconnection techniques—wire bond and flip chip—are commonly used to mount and electrically connect semiconductor dies (or "chips") on interconnection substrates. The wire bond technique presents wire bond pads (typically formed from aluminum ("Al")) on the substrate surface. The flip chip technique presents solder pads (typically formed as solder balls) on the substrate surface.

Flip chip interconnections provide the shortest electrical connecting paths, and therefore the highest electrical performance and speed. Flip chip interconnections also accommodate the greatest number of chips and chip connections within a given space because the flip chip technique can present area arrays at any location, including the center area of the die. In contrast, the wire bond technique is a perimeter method only, and is therefore more limited.

Flip chip is therefore increasingly the interconnect method of choice for high performance semiconductor devices. However, wire bonds have the important ability to "program" the wiring locations and eliminate expensive manufacturing tooling. The wire bond connection method has also been known and used for a much longer time and is much more popular. Wire bond is therefore expected to continue to be a principle interconnection method.

Input/output ("I/O") pads for flip chips can be configured as peripheral arrays, area arrays, or both, and are given a final finish of solder-wettable metal because solder bumps are subsequently formed or connected to the I/O pads. While techniques have been tried for soldering directly to the Al pads of the underlying integrated circuit, it is well known and accepted that Al is a difficult and undesirable material for soldering. A conventional solution has therefore been to apply a finish of a different metal, or several metals, to the Al pads prior to providing the solder bumps (i.e., prior to "bumping"). Since this additional metal finish ends up under the solder bumps, it is referred to as under-bump metallization ("UBM").

A typical UBM metal stack consists of metallic adhesion, barrier and wetting layers. One such structure that meets these requirements is a composite of layers of titanium ("Ti"), nickel-vanadium ("NiV"), and Cu. Ti is deposited first to adhere to the underlying Al pads, and typically is deposited on and adheres as well to the exposed passivation surface of the substrate outside the Al pad contact areas. Ti is known to adhere well to various materials such as Al, polyimide, benzocyclobutene ("BCB"), silicon nitride ("$Si_xN_x$"), and silicon oxide ("$SiO_x$").

Next, NiV is deposited onto the Ti layer to barrier the diffusion of Cu into the Ti. Cu is then deposited last, onto the NiV layer.

Once the UBM metal layers have been formed, the portions thereof outside the UBM contact areas must be selectively removed in order to define the desired contact patterns. Two known removal methods have been used in forming UBM pads on wafers that are also to have Al wire-bonding pads. One method is the lift-off technique; the other is the etch-back process.

The lift-off technique involves using a shadow mask prior to formation of the UBM layers. The mask is typically a photo resist, which is an organic material. One process for depositing the UBM metals is sputtering, and, due to the organic photo resist, the lift-off technique requires rigorously controlling the sputtering temperature during deposition of the UBM metals. Unfortunately, some sputtering tools do not have sufficient temperature control capability for sputtering the relatively thick UBM metal layers. In addition, the lift-off method is often not cost effective. For example, as compared with the etch-back process, more metals are required for sputtering onto the substrate because of the shadow effect of the mask.

The etch-back process uses an etching mask following formation of the UBM layers, so no such sputtering temperature controls are required. The UBM stacks are then defined by wet etching or dry etching the deposited UBM metals that are exposed (unprotected) by the mask.

However, the etch-back process has certain limitations as well. One such limitation is selectivity. In integrated wire bond and flip chip designs, the Al pads need to be exposed for wire bonding. It is therefore important to have an etchant that selects for the UBM metals but does not select for Al. In the case of UBM structures formed of Ti/NiV/Cu, the wet etching of the Ti/NiV/Cu layers is not a problem with respect to the UBM layers, but it is a problem with respect to exposed Al wire-bonding pads due to possible poor selectivity, particularly during the Ti etching phase.

Dry etching of Ti has better selectivity over Al. However, dry etching of Ti contaminates the process chamber quickly and attacks the polyimide surface of the passivation layer. As a consequence, if the sputtering tool is not capable of supporting the lift-off technique, the wet etching of the Ti is usually the only reasonable option.

When a Cu layer is present, a typical Ti etching solution used in the semiconductor industry is a mixture of hydrofluoric acid ("HF") and de-ionized ("DI") water. However, Al is an amphoteric metal that can be dissolved in both acid and base. Consequently, common Ti etchants such as this typically have poor selectivity over Al, typically over 1:10 (Ti:Al). During the etching of the Ti, the Al wire-bonding pads can therefore be seriously attacked, to the extent that they become disconnected from their circuits in the die.

Another problem with respect to such wet etching with HF is that the presence of Cu and NiV in the etching process causes a residue of Ti to be left on the polyimide surface. This residue shows up only after a follow-up plasma treatment of the surface.

Still another problem with respect to wet etching is endpoint detection for the etching process. In the conventional wet etching process of Ti, at the end of the etching of the thin and shining Ti layer, the layer disappears suddenly with a lot of bubbles. This makes it hard to detect the endpoint of the entire process because the sudden disappearance of the Ti layer does not mean that the Ti on the underlying passivation layer has been cleared or removed.

Thus, a need still remains to integrate both wire bond and flip chip methods and techniques together on chips and/or their substrates. A need also remains for an effective Ti etchant for such integrated wire bond and flip chip designs. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system. A precursor for an integrated wire bond and flip chip structure is provided. The precursor has a plurality of contact pads thereon. A layer of titanium is deposited on the precursor. A layer of nickel-vanadium is deposited on the layer of titanium. A layer of copper is deposited on the layer of nickel-vanadium. A mask is formed on at least a portion of the layer of copper. Portions of the layers of copper and nickel-vanadium not protected by the mask are removed to expose portions of the layer of titanium. The exposed portions of the layer of titanium are etched with an etching solution consisting of an etchant, a viscosity modifier, and an oxidizer.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
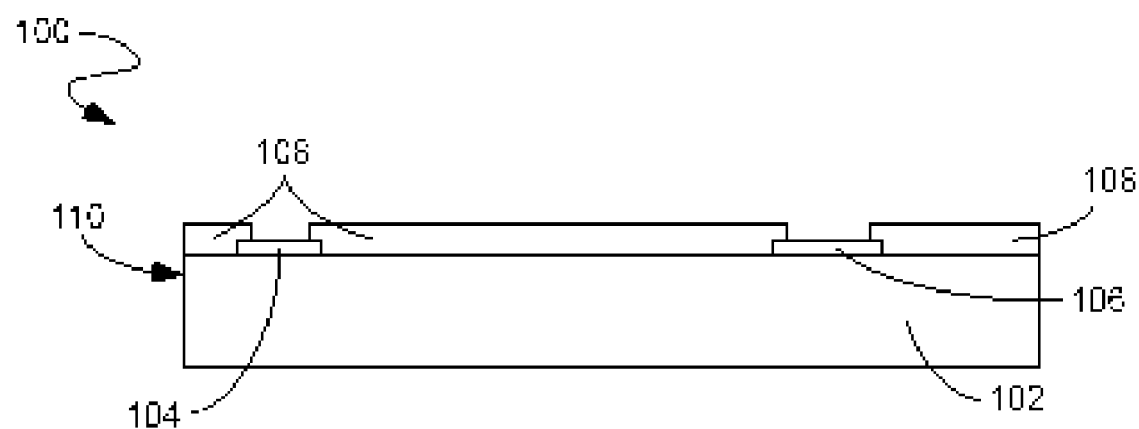
FIG. 1 is a cross-sectional view of a portion of a semiconductor substrate in an intermediate stage of manufacture.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the invention are semi-diagrammatic and not to scale and, particularly, some of the dimensions are for the clarity of presentation and are shown exaggerated in the drawing FIGS. Also, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

In the manufacture and assembly of electronic devices, two common high-density interconnection techniques—wire bond and flip chip—are used to mount and electrically connect semiconductor dies (or "chips") on interconnection substrates. Interconnection substrates for these techniques include silicon, ceramic, and flexible plastic, as well as printed circuit boards.

The wire bond technique presents input/output ("I/O") wire bond pads (typically formed as aluminum ("Al") pads) on the surface of the substrate. The pads are peripheral arrays with a final finishing layer of Al or Al alloy. Al is used because gold wires that are used for wire bonding cannot be readily bonded onto copper ("Cu") pads. Such gold wire is typically used for wireless applications, especially at high frequency, to lower circuit inductance and cross talk.

The flip chip technique presents solder pads (typically formed as solder balls) on the surface of the substrate.

To realize the benefits and virtues of both the flip chip and the wire bond techniques, it is desirable to integrate both the flip chip and the wire bond methods and techniques together on chips and/or their substrates. Such an integrated, dual-connection configuration can be helpful in reducing package sizes, and would be of particular value in the development of three dimensional ("3D") packages. (3D packaging is a technique for stacked chip package integration.)

The memory and radio frequency ("RF") functional integration for cell phones and wireless local area networks ("WLANs") is currently being accomplished through system-in package ("SiP") die package configurations. 3D packaging is a sub-segment of SiP developments. 3D packaging allows further system integration through stacking of diverse device technologies, including flash, static random access memory ("SRAM"), and dynamic random access memory ("DRAM"), as well as baseband, mixed signal, analog, and logic functions. Stacked chip package integration is expected to be critical to allowing the pace of cellphone handset size, weight, and cost reductions to continue, as well as to allowing new handset form factors to be developed.

The present invention relates to integrated wire bond and solder bump metallization, and to patterning methods and techniques for forming such integrated wire bond and solder bump metallization configurations. Improved etch-back process methods and configurations are disclosed for applying under-bump metallization ("UBM") for integrated wire-bonded and flip chip interconnections on semiconductor device substrates. In one embodiment the metallization is applied to a subset of wire bond pads of Al or Al alloys to form UBM pads that are a composite structure of layers of titanium ("Ti"), nickel-vanadium ("NiV"), and copper ("Cu"). It has been discovered that problems in etching a Ti layer on a polyimide passivation layer exposed to the co-existence of Cu and Al can be overcome, as described more particularly herewithin. In one embodiment, these several problems are overcome by using a chemical etchant that contains a viscosity modifier and an oxidizer added to the Ti etching solution.

A component package may include several interconnected circuit boards or dies. For example, a smaller board may be mounted directly onto a larger board, or a smaller die may be mounted directly onto a larger die. In one configuration, for example, a larger die may have a peripheral array of wire bonding pads and a central area array of UBM pads. The UBM pads are configured for receiving a mirror-matched area array of UBM pads on a smaller die. The smaller die is then directly attached and electrically connected to the larger die by joining the matching UBM pads on the two dies. The larger die may then be connected to a circuit board or a leadframe by means of its peripheral array of wire bonding pads, for example.

The underlying contacts pads on a die are commonly formed of Al. For connections that are to be soldered to the contact pads, it is common practice to then form UBM contact pads on the Al pads to overcome the difficulty of soldering directly to Al. The UBM pads provide a finish of a different metal, or of several metals, to the Al pads prior to providing solder bumps thereon (i.e., prior to "bumping").

Typically, the die will have a passivation layer on its surface, with openings through the passivation layer to the Al contact pads on the die. The passivation layer materials may be, for example, polyimide, benzocyclobutene ("BCB"), polybenzoxazole ("PBO"), silicon oxide ("$SiO_x$"), silicon nitride ("$Si_xN_x$") or other known passivation materials.

The formation of the UBM pads onto the Al pads typically begins by depositing UBM metal layers onto the pads and the passivation layer on the die. The individual metal layers are deposited either by evaporation or sputtering. Sputtering is a conveniently manageable process that generally forms the several layers evenly across the entire target substrate.

Once the UBM metal layers have been formed, the portions thereof outside the target Al contact pad areas must be selectively removed in order to form and define the desired UBM contact pad patterns. Two known removal methods have been used for this phase in forming the UBM pads. One method is the lift-off technique. The other method is the etch-back process.

The lift-off technique involves using a lift-off mask prior to formation of the UBM metal layers. The lift-off mask, which has openings therethrough over the Al pads on the die, is typically a photo-definable polymer photoresist that is applied onto the die either by a lamination process or by spin coating. The UBM metal layers are then formed on the lift-off mask and inside the lift-off mask openings above the Al pad contact areas. After the deposition of the UBM layers, the lift-off mask is removed by dissolving in suitable solvents or developer. In this manner, the UBM metal layer stack is left on the Al contacts under the openings but removed everywhere else.

The lift-off technique has several drawbacks due to the lift-off mask. One drawback is that the photo-definable polymer requires that the sputtering temperature be kept below a certain level. Another drawback is that the shadow effect of the sputtering for the lift-off technique does not produce the best edge definition for the UBM pads. Still another drawback is that a high pressure de-ionized water scrubber is typically used to get well-defined UBM pads. Additionally, the lift-off technique is often not cost effective since, as compared with the etch-back process, more metal is required for sputtering onto the substrate because of the shadow effect of the mask.

In contrast, the etch-back process uses an etching mask that is applied following formation of the UBM layers on the passivation layer. The UBM stacks are then defined by either wet etching or dry etching of the deposited UBM metals that are exposed (unprotected) by the etching mask.

Referring now to FIG. 1, therein is shown a cross-sectional view 100 of a portion of a substrate 102 onto which UBM layers are to be selectively formed using the etch-back process. The substrate 102 is a semiconductor die having one or more semiconductor devices (not shown) formed therein, and having contact pads 104 and 106 formed on the upper surface of the substrate 102. The contact pads 104 and 106 in this embodiment are formed of Al. Also formed on the upper surface of the substrate 102 is a passivation layer 108 through which the contact pads 104 and 106 are exposed.

In accordance with the present invention, a UBM pad is then to be formed on the contact pad 106 as further described below, while the contact pad 104 is to form an exposed wire bonding pad. The structure shown in FIG. 1 is therefore a precursor 110 for an integrated wire bond and flip chip semiconductor structure, in which the contact pad 104 will form an exposed wire bonding pad and the contact pad 106 will have a UBM pad formed thereon.

Figure 2:
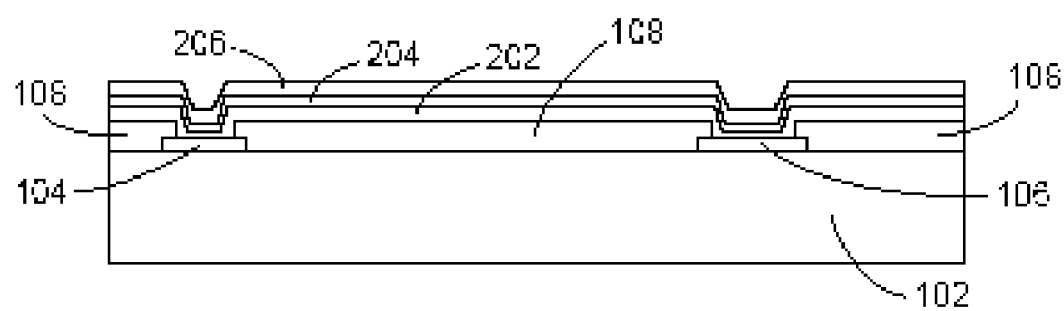
FIG. 2 shows the structure of FIG. 1 following deposition thereon of a multilayer metallic structure from which a UBM stack will be formed.

Referring now to FIG. 2, therein is shown the structure of FIG. 1 after deposition on the contact pads 104 and 106 and the passivation layer 108 of individual layers of the metals that form a multilayer structure from which the UBM stack will subsequently be formed. These layers include a Ti layer 202, a NiV layer 204, and a Cu layer 206. Sputtering is the preferred deposition method for depositing the layers because of the higher throughput that sputtering affords. Alternatively, other deposition techniques such as evaporation can also be used.

Ti has good adhesion to both the Al contact pad 106 and the passivation layer 108. It also has good corrosion resistance. In one embodiment, the Ti layer 202 is the first layer and has a thickness in the range of 300-2000 Angstroms ("Å"), and preferably 800-1200 Å.

The NiV layer 204 is the second layer and provides a diffusion barrier layer between the Ti layer 202 and the subsequently formed Cu layer 206. The thickness of the NiV layer 204 in one embodiment is in the range of 2000-7000 Å, and preferably 3000-4000 Å.

The Cu layer 206 is the final layer. The Cu layer 206 is a solder-wettable layer, and solder bumps are commonly used subsequently for the interconnection interface. The thickness of the Cu layer 206 in one embodiment is in the range of 3000-15000 Å, and preferably 6000-9000 Å.

Figure 3:
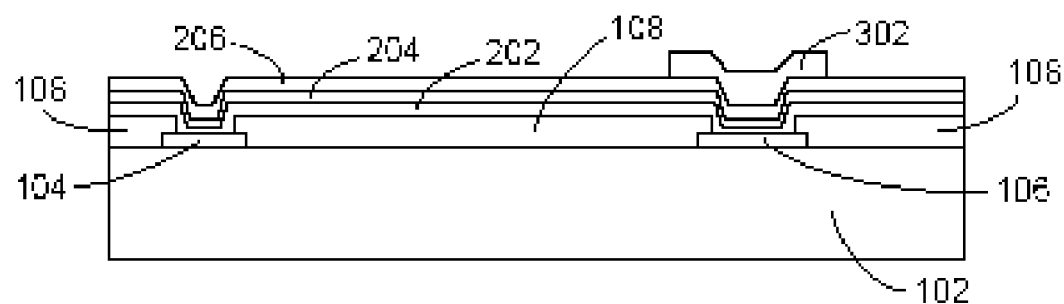
FIG. 3 shows the structure of FIG. 2 following deposition thereon of an etching mask to cover the solder bumping area.

Referring now to FIG. 3, therein is shown the structure of FIG. 2 following deposition thereon of an etching mask 302 to cover the solder bumping area over the contact pad 106. The etching mask 302 may be a photoresist that is spin coated and formed by photolithographic processes.

Figure 4:
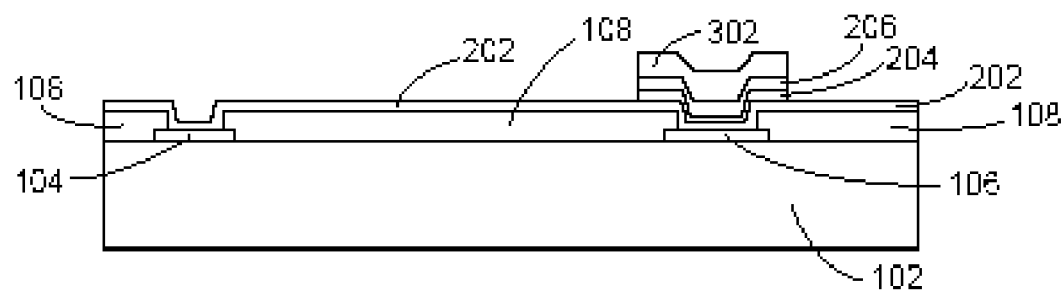
FIG. 4 shows the structure of FIG. 3 following removal of the portions of the Cu layer and the NiV layer not protected by the etching mask.

Referring now to FIG. 4, therein is shown the structure of FIG. 3 following removal, as by etching, of the portions of the Cu layer 206 and the NiV layer 204 not protected by the etching mask 302, to expose and leave behind corresponding portions of the Ti layer 202, as shown. The Cu and NiV layers 206 and 204 may be removed, for example, using any suitable etchant composition as is conventionally known in the art for this purpose.

Figure 5:
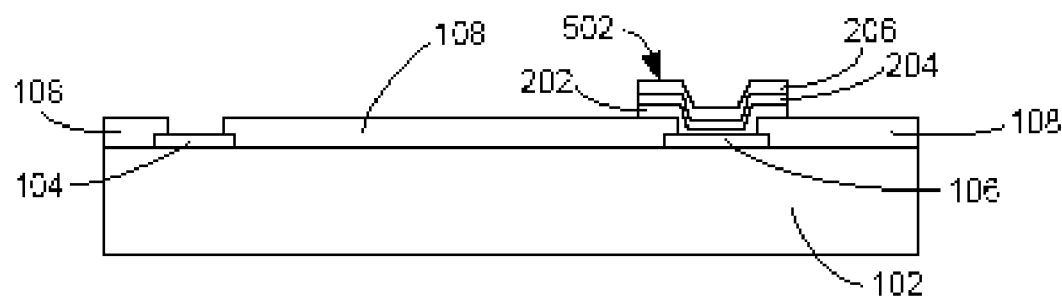
FIG. 5 shows the structure of FIG. 4 following removal of the etching mask and removal of the Ti layer from areas not protected by the NiV layer and the Cu layer.

Referring now to FIG. 5, therein is shown the structure of FIG. 4 following removal of the etching mask 302 (FIG. 4)

and removal of the Ti layer 202 from areas not protected by the NiV layer 204 and the Cu layer 206. The removal of these portions of the Ti Layer 202, which exposes the Al pads 104 for wire bonding, is accomplished with a different etching solution, as discussed further below, than was used for removing the exposed portions of the Cu and NiV layers 206 and 204. The remaining portions of the Ti, NiV, and Cu layers 202, 204, and 206 then form a UBM stack 502.

Figure 6:
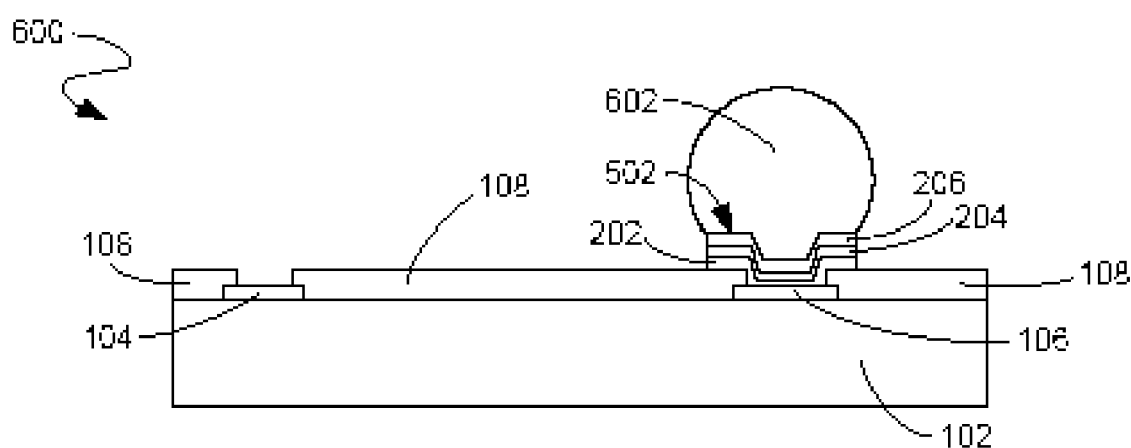
FIG. 6 shows the structure of FIG. 5 following bumping of the UBM stack in accordance with an embodiment of the present invention.

Referring now to FIG. 6, therein is shown the structure of FIG. 5 following bumping of the UBM stack 502 with a solder ball 602, thereby completing an integrated wire bond and flip chip structure 600 in accordance with an embodiment of the present invention. The contact pad 104 and the UBM stack 502 are then ready, respectively, for wire bonded and flip chip interconnections.

Referring again to the process depicted in FIG. 5, the important etching step at this stage is the removal of the exposed portions of the Ti layer 202 without causing severe damage to the underlying Al pads such as the contact pad 104. This is important in order to protect and preserve the contact pad 104 for later wire bonding. The removal of the exposed portions of the Ti layer 202 must also be performed without leaving residues of Ti on the surface of the passivation layer 108. Otherwise, such Ti residues will show up in subsequent plasma cleaning.

It has been discovered that it is not sufficient just to use a basic Ti etching solution of diluted hydrofluoric acid ("HF"). This is because Al is an amphoteric metal that can be dissolved in both acid and base. If only HF, diluted for example with de-ionized ("DI") water, is used, the Al of the contact pad 104 (the wire bonding pad) is still severely attacked during the etching of the Ti layer 202 with the diluted HF. This is because common Ti etchants such as this typically have poor selectivity over Al, typically over 1:10 (Ti:Al). The attack can cause the Al wire-bonding pads to become disconnected from their circuits in the die. In addition, due to the presence of Cu and NiV (in the Cu layer 206 and the NiV layer 204), a Ti residue is also left behind at the interface of the Ti layer 202 with the passivation layer 108.

However, it has also been discovered, as taught according to an embodiment of the present invention, that a large amount of viscosity modifier, such as propylene glycol, can be added to the diluted HF etchant, and the combination of the diluted etchant and viscosity modifier is then able to successfully etch the Ti layer 202 without significantly damaging the Al contact pad 104. The viscosity modifier additive increases the viscosity of the etchant and thereby reduces the etching rate of the etchant on the Al, so that the contact pad 104 is accordingly characterized by the reduced etching effect of the etchant on the Al contact pad. A low amount of oxidizer, such as hydrogen peroxide ("$H_2O_2$"), is also added to the etching solution to remove the residue completely from the interface of the Ti layer 202 and the passivation layer 108.

The following example of one embodiment of the etching solution of the present invention demonstrates its effectiveness:

40 ml of 31% $H_2O_2$, 20 ml of 39% HF, 350 ml of propylene glycol, and 70 ml of water were added into a beaker to form a solution by mixing the ingredients. The Ti layer 202 in the structure shown in FIG. 4 was etched by this solution in the presence of the Cu layer 206, the NiV layer 204, and the passivation layer 108. The etching of the Ti layer 202 occurred at a rate of approximately 1500 Å per minute without undercutting either the Cu layer 206 or the NiV layer 204, and without leaving a residue on the surface of the passivation layer 108. At the same time, the selectivity to the Al contact pad 104 was about 1.4:1, thereby preventing severe damage to it. Subsequently completed and packaged units, with integrated wire bonded and solder bumped connections respectively to the contact pad 104 and the UBM stack 502, were successful and passed temperature cycling and thermal aging reliability tests.

Based on this disclosure, it will now be clear to one of ordinary skill in the art that the chemical ingredients and the proportions of the ingredients of the solution in the above example can be varied within reasonable limits and still provide the benefits of the invention. The basic aspect of the invention can thus be described as etching the Ti layer on the passivation layer, in the presence of Cu and NiV, with an etching solution having a viscosity modifier and an oxidizer, the viscosity modifier improving the selectivity to the Al, and the oxidizer preventing a Ti residue from being left on the surface of the passivation layer. The viscosity modifier includes materials such as propylene glycol and ethylene glycol. The oxidizer includes materials such as $H_2O_2$ and sulfuric acid ("$H_2SO_4$"). The HF in solution is the active ingredient used to remove the Ti.

Expressing the etching solution in terms of volume percent, an effective amount of the ingredients would lie in the approximate range:

| | |
|---|---|
| HF: | 0.5-3% |
| $H_2O_2$: | 1-8% |
| Propylene glycol: | 50-95.5% |

Although these ranges are currently believed to be the most effective, it will now be clear to those skilled in the art, based upon the teachings and discoveries disclosed herein, that other proportions and other functional ingredients that obtain substantially equivalent results may also be used. The vitalizing feature of the invention is the inclusion in the etching solution of a viscosity modifier that inhibits the attack of the etchant on the Al, and an oxidizer that prevents Ti residue from being left on the top of the passivation layer.

Other etchants besides HF may also be considered, as will be understood by one of ordinary skill in the art based upon the teachings of this disclosure. For example, ammonium hydroxide ("$NH_4OH$") may be considered for use as a reducing agent for etching the Ti thin film. However, there may be concerns about the comparative effectiveness, as well as possible discoloration of the underlayer of the Al pad metal, depending upon the process parameters. Also, shelf life of the mixed chemical, and the etching selectivity over Al, Cu, and NiV need to be considered in the context of the specific application at hand. Other, in some cases similar, considerations will likewise obtain when other etchants are considered as well.

Figure 7:
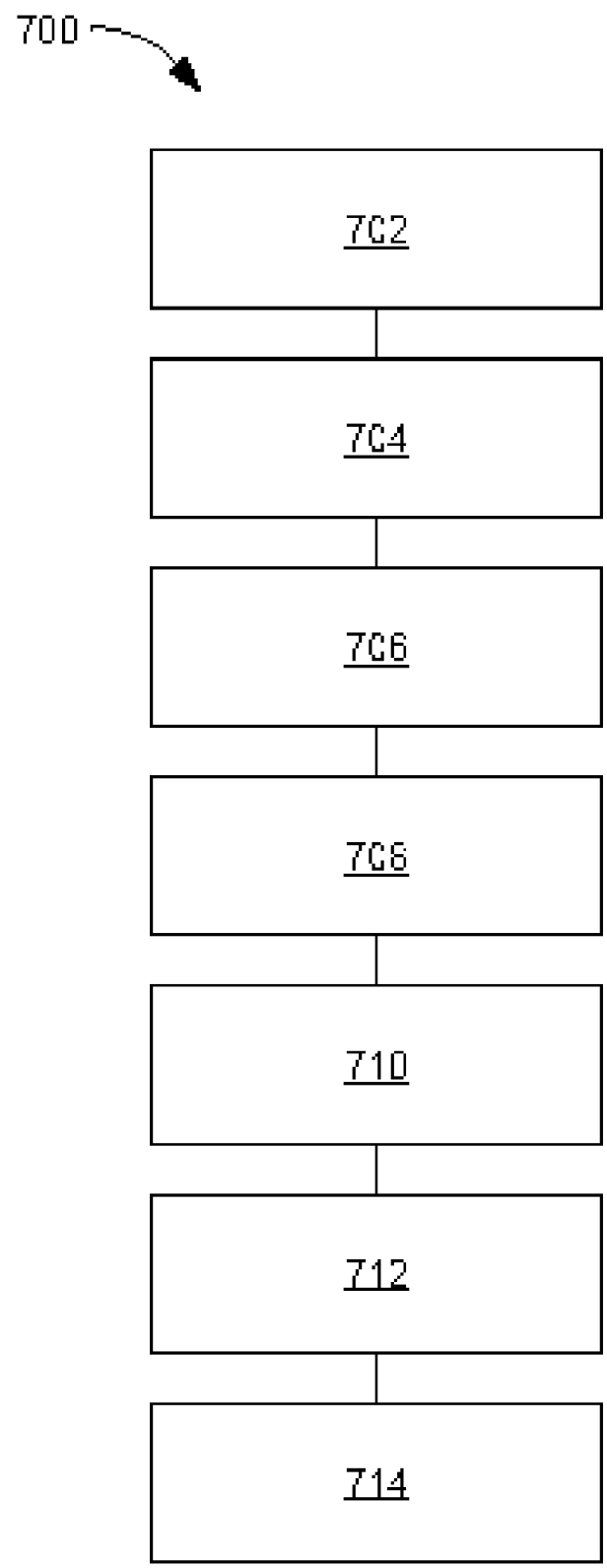
FIG. 7 is a flow chart for an integrated circuit system in accordance with an embodiment of the present invention.

Referring now to FIG. 7, therein is shown a flow chart for an integrated circuit system 700 in accordance with an embodiment of the present invention. The integrated circuit system includes providing a precursor for an integrated wire bond and flip chip structure, the precursor having a plurality of contact pads thereon, in a block 702; depositing a layer of titanium on the precursor, in a block 704; depositing a layer of nickel-vanadium on the layer of titanium, in a block 706; depositing a layer of copper on the layer of nickel-vanadium, in a block 708; forming a mask on at least a portion of the layer of copper, in a block 710; removing portions of the layers of copper and nickel-vanadium not protected by the mask to expose portions of the layer of titanium, in a block 712; and etching the exposed portions of the layer of titanium with an etching solution consisting of an etchant, a viscosity modifier, and an oxidizer, in a block 714.

It has thus been discovered that the present invention has numerous advantages.

One advantage of the present invention is the economical and highly effective provision of packaging level reliability for integrated wire bond and flip chip semiconductor structures.

A principle advantage is the discovery of an etching solution for etching Ti in the presence of Cu, NiV, and Al, with an etch selectivity that essentially preserves the Cu and NiV and keeps an acceptable integrity of Al that is configured as wire bonding pads.

Another advantage is that the etching solution according to one embodiment of the invention is a readily prepared basic HF solution with a viscosity modifier to slow the attack on Al, and an oxidizer to prevent a residue of Ti from being left on a passivation layer surface.

Still another advantage is that the present invention provides packaging level reliability for integrated wire bond and flip chip semiconductor structures.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the integrated wire bond and solder bump metallization and patterning method and apparatus of the present invention furnish important and heretofore unknown and unavailable solutions, capabilities, and functional advantages for realizing the benefits and virtues of both flip chip and wire bond techniques in semiconductor structures, for integrating both flip chip and wire bond methods and techniques together on chips and/or their substrates. The resulting processes and configurations are straightforward, cost-effective, uncomplicated, highly versatile and effective, can be implemented by adapting known technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit system, comprising:
   providing a precursor for an integrated wire bond and flip chip structure, the precursor having a plurality of aluminum contact pads thereon;
   depositing a layer of titanium on the precursor;
   depositing a layer of nickel-vanadium on the layer of titanium;
   depositing a layer of copper on the layer of nickel-vanadium;
   forming a mask on at least a portion of the layer of copper;
   removing portions of the layers of copper and nickel-vanadium not protected by the mask to expose portions of the layer of titanium; and
   etching to remove the exposed portions of the layer of titanium with an etching solution consisting of an etchant, a viscosity modifier, and an oxidizer.

2. The system of claim 1 wherein:
   etching further comprises etching with an etchant selected from a group consisting of hydrofluoric acid, ammonium hydroxide, and a combination thereof.

3. The system of claim 1 wherein etching further comprises:
   using a viscosity modifier selected from a group consisting of propylene glycol, ethylene glycol, and a combination thereof; and
   using an oxidizer selected from a group consisting of hydrogen peroxide, sulfuric acid, and a combination thereof.

4. The system of claim 1 in which etching further comprises forming an etching solution of approximately 0.5-3% hydrofluoric acid, 1-8% hydrogen peroxide, and 50-95.5% propylene glycol.

5. The system of claim 1 wherein:
   depositing a layer of titanium further comprises depositing a layer of titanium to a thickness in the range of 300-2000 Å;
   depositing a layer of nickel-vanadium further comprises depositing a layer of nickel-vanadium to a thickness in the range of 2000-7000 Å; and
   depositing a layer of copper further comprises depositing a layer of copper to a thickness in the range of 3000-15000 Å.

6. An integrated circuit system, comprising:
   providing a precursor for an integrated wire bond and flip chip semiconductor structure, the precursor having a passivation layer and a plurality of exposed aluminum contact pads thereon;
   depositing a layer of titanium on the precursor;
   depositing a layer of nickel-vanadium on the layer of titanium;
   depositing a layer of copper on the layer of nickel-vanadium;
   forming a photomask on a portion of the layer of copper over one of the contact pads;
   etching portions of the layers of copper and nickel-vanadium not protected by the photomask to expose and leave behind corresponding portions of the layer of titanium;
   etching and removing the exposed portions of the layer of titanium in the presence of the layers of copper and nickel-vanadium with an etching solution consisting of hydrofluoric acid, a viscosity modifier, and an oxidizer;
   removing the photomask; and
   solder bumping the layer of copper over the one contact pad.

7. The system of claim 6 wherein etching and removing the exposed portions of the layer of titanium further comprises:
   using a viscosity modifier selected from a group consisting of propylene glycol, ethylene glycol, and a combination thereof; and
   using an oxidizer selected from a group consisting of hydrogen peroxide, sulfuric acid, and a combination thereof.

8. The system of claim 6 in which etching and removing the exposed portions of the layer of titanium further comprises forming an etching solution of approximately 0.5-3% hydrofluoric acid, 1-8% hydrogen peroxide, and 50-95.5% propylene glycol.

9. The system of claim 6 wherein:

depositing a layer of titanium further comprises depositing a layer of titanium to a thickness in the range of 300-2000 Å, and preferably 800-1200 Å;

depositing a layer of nickel-vanadium further comprises depositing a layer of nickel-vanadium to a thickness in the range of 2000-7000 Å, and preferably 3000-4000 Å; and depositing a layer of copper further comprises depositing a layer of copper to a thickness in the range of 3000-15000 Å, and preferably 6000-9000 Å.

10. An integrated circuit system, comprising:

a precursor for an integrated wire bond and flip chip structure, the precursor having a plurality of aluminum contact pads thereon;

a layer of titanium on at least a portion of the precursor;

a layer of nickel-vanadium on the layer of titanium;

a layer of copper on the layer of nickel-vanadium; and at least one of the contact pads being characterized by the effect of an etchant solution consisting of an etchant, a viscosity modifier, and an oxidizer.

11. The system of claim 10 wherein the etchant is an etchant selected from a group consisting of hydrofluoric acid, ammonium hydroxide, and a combination thereof.

12. The system of claim 10 wherein the viscosity modifier is selected from the group consisting of propylene glycol, ethylene glycol, and a combination thereof, and the oxidizer is selected from the group consisting of hydrogen peroxide, sulfuric acid, and a combination thereof.

13. The system of claim 10 in which the etching solution is approximately 0.5-3% hydrofluoric acid, 1-8% hydrogen peroxide, and 50-95.5% propylene glycol.

14. The system of claim 10 wherein the layer of titanium has a thickness in the range of 300-2000 Å, the layer of nickel-vanadium has a thickness in the range of 2000-7000 Å, and the layer of copper has a thickness in the range of 3000-15000 Å.

15. An integrated circuit system, comprising:

a precursor for an integrated wire bond and flip chip semiconductor structure, the precursor having a passivation layer and a plurality of exposed aluminum contact pads thereon;

a layer of titanium on at least a portion of the precursor and over at least a first contact pad;

a layer of nickel-vanadium on the layer of titanium and over at least the first contact pad;

a layer of copper on the layer of nickel-vanadium and over at least the first contact pad;

at least one of the contact pads being characterized by the effect, in the presence of the layers of copper and nickel-vanadium, of an etchant solution consisting of hydrofluoric acid, a viscosity modifier, and an oxidizer; and a solder bump on the layer of copper over the first contact pad.

16. The system of claim 15 wherein the viscosity modifier is selected from the group consisting of propylene glycol, ethylene glycol, and a combination thereof, and the oxidizer is selected from the group consisting of hydrogen peroxide, sulfuric acid, and a combination thereof.

17. The system of claim 15 in which the etching solution is approximately 0.5-3% hydrofluoric acid, 1-8% hydrogen peroxide, and 50-95.5% propylene glycol.

18. The system of claim 15 wherein:

the layer of titanium has a thickness in the range of 300-2000 Å, and preferably 800-1200 Å;

the layer of nickel-vanadium has a thickness in the range of 2000-7000 Å, and preferably 3000-4000 Å; and the layer of copper has a thickness in the range of 3000-15000 Å, and preferably 6000-9000 Å.

* * * * *